United States Patent
Huang et al.

(10) Patent No.: US 10,672,499 B2
(45) Date of Patent: Jun. 2, 2020

(54) NAND FLASH MEMORY CONTROLLER AND STORAGE APPARATUS APPLYING THE SAME

(71) Applicant: RayMX Microelectronics, Corp., Anhui province (CN)

(72) Inventors: Shih-Fu Huang, Hsinchu (TW); Shu-Min Lin, Hsinchu (TW); Jo-Hua Wu, Hsinchu (TW); Cheng-Yu Chen, Hsinchu (TW)

(73) Assignee: RAYMX MICROELECTRONICS CORP., Hefei, Anhui Province (CN)

( * ) Notice: Subject to any disclaimer, the term of this patent is extended or adjusted under 35 U.S.C. 154(b) by 0 days.

(21) Appl. No.: 16/244,321

(22) Filed: Jan. 10, 2019

(65) Prior Publication Data
US 2020/0075107 A1    Mar. 5, 2020

(30) Foreign Application Priority Data
Aug. 31, 2018   (TW) .............................. 107130743 A (51) Int. Cl.
*G11C 29/50* (2006.01)
*G11C 16/28* (2006.01)
(Continued)

(52) U.S. Cl.
CPC .......... *G11C 29/50* (2013.01); *G01R 31/2843* (2013.01); *G06F 3/0679* (2013.01);
(Continued)

(58) Field of Classification Search
CPC ................ G11C 29/04; G11C 29/4401; G11C 2029/0409; G11C 2029/5006; G01R 31/2843
See application file for complete search history.

(56) References Cited

U.S. PATENT DOCUMENTS

| 9,390,814 B2 * | 7/2016 | Ellis ................. G11C 29/04 |
| 9,454,448 B2 * | 9/2016 | Ellis ................. G06F 11/2635 |
| 10,509,591 B2 * | 12/2019 | Tidwell ................. G06F 1/3275 |

FOREIGN PATENT DOCUMENTS

TW        201810281 A      3/2018

OTHER PUBLICATIONS hc360.com, "Do you know this useful skill for the measurement of multimeter?", Jan. 23, 2017, read01.com, https://read01.com/zh-tw/RDDjjG.html#.XG32w-gzaUk.
(Continued)

*Primary Examiner* — Vanthu T Nguyen
(74) *Attorney, Agent, or Firm* — McClure, Qualey & Rodack, LLP (57) ABSTRACT

A flash memory controller is suitable for a NAND flash memory and a voltage supply circuit. The voltage supply circuit supplies a current to the flash memory. The flash memory controller includes a flash control circuit, a current sensing circuit, and a processor. The flash control circuit is configured to control an operation of the flash memory. The current sensing circuit is configured to measure the current consumed by the flash memory during its operation, and output a current value. The processor is configured to output a control signal based on the current value. Therefore, the flash memory controller can instantly obtain a current value consumed during the operation of flash memory, and determine, based on the current value, whether the flash memory runs normally. A storage apparatus having the flash memory controller can instantly determine whether the flash memory runs normally.

12 Claims, 5 Drawing Sheets

(51) Int. Cl.
    *G06F 3/06*           (2006.01)
    *G11C 29/44*         (2006.01)
    *G01R 31/28*        (2006.01)
    *G11C 29/02*         (2006.01)
    *G11C 29/04*         (2006.01)

(52) U.S. Cl.
    CPC ............ *G11C 16/28* (2013.01); *G11C 29/028* (2013.01); *G11C 29/4401* (2013.01); *G11C 2029/0409* (2013.01); *G11C 2029/5006* (2013.01)

(56) References Cited

OTHER PUBLICATIONS

Office Action issued in corresponding Taiwan patent application dated Feb. 22, 2019.
English translation of relevant paragraph of hc360.com, "Do you know this useful skill for the measurement of multimeter?", Jan. 23, 2017, read01.com, https://read01.com/zh-tw/RDDjjG.html#.XG32w-gzaUk.

\* cited by examiner

NAND FLASH MEMORY CONTROLLER AND STORAGE APPARATUS APPLYING THE SAME

CROSS-REFERENCE TO RELATED APPLICATION

This non-provisional application claims priority under 35 U.S.C. § 119(a) to Patent Application No. 107130743 in Taiwan, R.O.C. on Aug. 31, 2018, the entire contents of which are hereby incorporated by reference.

BACKGROUND

Technical Field

The present disclosure relates to a flash memory controller, and in particular, to a NAND flash memory controller.

Related Art

NAND flash memories are mostly applied to solid state drives (SSDs), flash drives, and memory cards because of their memory performance.

For each cell of a NAND flash memory, information stored in the cell is represented based on a voltage state of the cell. Using a triple-level cell (TLC) as an example, each triple-level cell can store eight different pieces of content, including: 111, 011, 001, 101, 100, 000, 010, and 110. The eight pieces of content respectively correspond to one erasing state and seven programming states. Specifically, when a recorded voltage of a triple-level cell is in a state, it indicates that content stored in the triple-level cell is the content corresponding to the state.

For the NAND flash memory, to ensure accuracy of data to be written, after the data is written into a cell, a controller inside the flash memory reads the voltage of the cell, and determines whether the voltage reaches a predetermined voltage range (greater than a lower limit of a corresponding state). If the predetermined voltage range is not reached, the data is written once again, until the voltage of the cell reaches the predetermined voltage range. This mechanism is generally referred to as verification. Therefore, for a cell that has relatively good performance or that is at the initial stage of life, an operational voltage of the cell is relatively low or a quantity of times of being written is relatively small. For a cell that has relatively poor performance or that is already worn, the cell may have been written repeatedly. Consequently, cells, memory pages, and memory blocks in the NAND flash memory have different quantities of times of being written. Hence, quantities of times of being programmed and erased of the flash memory directly affect service life of the flash memory. To avoid loss of stored data caused by that a large quantity of NAND flash memories are damaged in a short time, the industry proposes several methods for determining whether a NAND flash memory is damaged.

One method is to predict possible life of the NAND flash memory by monitoring whether the number of error correct codes (ECCs) tends to increase. However, the flash memory has the foregoing verification mechanism, and the number of ECCs does not apparently change during normal operation. Therefore, if the number of the ECCs is monitored, when the number of the ECCs is found to instantly increase, generally a block in the flash memory is close to the end of life. Therefore, the accurate life status of the flash memory cannot be effectively learned by monitoring the number of the ECCs.

Another method is to predict the life by using a cell voltage distribution (or called as an incremental step programming pulse, ISPP). A cell voltage distribution is a graph in which a recorded voltage of each cell in an entire memory page or a memory block is drawn. A horizontal axis of the graph indicates the voltage, and a vertical axis indicates a cell quantity. When the flash memory is in a normal state, in the voltage distribution, voltages of cells are properly in corresponding states. When the flash memory is in an abnormal state, the quantity of cells in the corresponding states is greatly reduced. As described above, the flash memory has the verification mechanism, and therefore, when the cell voltage distribution shows an abnormality, the flash memory is close to the end of life. Therefore, the life state, of the time, of the flash memory cannot be effectively learned according to this method.

SUMMARY

The foregoing method only has a capability of determining that a flash memory is close to the end of life, and the known method can be performed only in an offline state (the NAND flash memory should be removed from a storage apparatus or system).

In view of the foregoing, this application provides a flash memory controller. The controller is suitable for a NAND flash memory and a voltage supply circuit, where the voltage supply circuit supplies a current to the flash memory. The flash memory controller includes a flash control circuit, a current sensing circuit, and a processor. The flash control circuit is configured to control writing, reading, and erasing operations of the flash memory. The current sensing circuit is configured to measure the current of the flash memory during the operation of the flash memory, and output a current value. The processor is configured to output a control signal based on the current value.

According to some embodiments, the current sensing circuit includes a current-to-voltage conversion circuit, a sensing control circuit, a state generation circuit, and a flash analog-to-digital circuit. The current-to-voltage conversion circuit is connected between the voltage supply circuit and the flash memory and is configured to convert the current into a differential voltage. The sensing control circuit is configured to generate a state signal. The state generation circuit is configured to generate a plurality of states based on the state signal. The flash analog-to-digital circuit is configured to output a digital signal based on the differential voltage and these states, where the sensing control circuit outputs the current value based on the state signal and the digital signal.

According to some embodiments, the state generation circuit includes an adjustable current source and a plurality of resistor. The adjustable current source is configured to generate a reference current based on the state signal. The resistors are connected in series, and these resistors receive the reference current and generate these states.

According to some embodiments, the sensing control circuit receives a plurality of the digital signals based on a time sequence, and adjusts the state signal based on these digital signals.

According to some embodiments, the storage apparatus includes the foregoing flash memory controller, voltage supply circuit, and NAND flash memory. The voltage supply circuit is configured to provide a current to the flash memory. The flash memory controller includes a flash control circuit, a current sensing circuit, and a processor. The flash control circuit is configured to control writing of the flash memory. The current sensing circuit is configured to measure the current of the flash memory during the operation of the flash memory, and output a current value. The processor is configured to output a control signal based on the current value.

In summary, according to some embodiments, the flash memory controller can instantly obtain a current value consumed during an operation of the flash memory, and determine, based on the current value, whether the flash memory runs normally. According to some other embodiments, the storage apparatus having the flash memory controller can instantly determine whether the flash memory runs normally.

DETAILED DESCRIPTION

Figure 1:
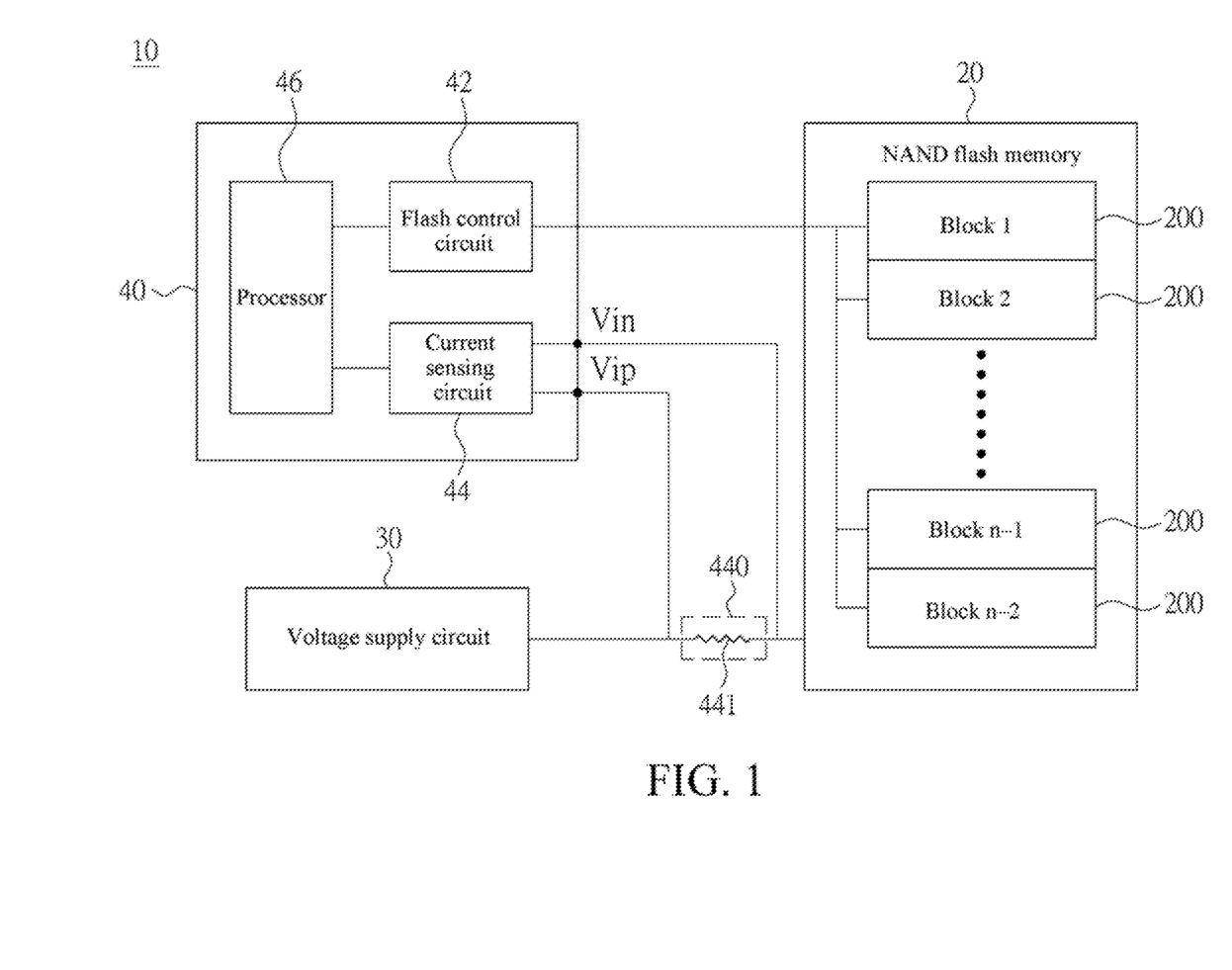
FIG. 1 illustrates a schematic circuit block diagram of a storage apparatus according to an embodiment of this application.

Referring to FIG. 1, FIG. 1 illustrates a schematic circuit block diagram of a storage apparatus according to an embodiment of this application. The storage apparatus 10 includes a NAND flash memory 20, a voltage supply circuit 30, and a flash memory controller 40.

The storage apparatus 10 may be any storage apparatus having the NAND flash memory 20. In some embodiments, the storage apparatus 10 is an SSD, a flash drive, or a memory card.

The voltage supply circuit 30 is configured to provide a current to the flash memory 20. The flash memory controller 40 is suitable for the NAND flash memory 20 and the voltage supply circuit 30. The flash memory controller 40 controls an operation of the flash memory 20. The operation may be programming, erasing, or reading. The programming and the erasing may be collectively referred to as writing. The flash memory 20 includes a plurality of blocks 200. Each block 200 includes a plurality of pages (not shown in the figure). When performing erasing, the flash memory 20 performs block erasing. When performing programming, the flash memory 20 performs page programming. Different current values are required by the flash memory 20 to perform programming, erasing, and reading, and the current is supplied by the voltage supply circuit 30.

The flash memory controller 40 includes a flash control circuit 42, a current sensing circuit 44, and a processor 46. The flash control circuit 42 is configured to control writing of the flash memory 20. Specifically, the flash control circuit 42 controls programming and erasing of the flash memory 20. In addition, the flash control circuit 42 also controls a task such as reading of the flash memory 20. Based on control of the processor 46, the flash control circuit 42 controls the flash memory 20 to perform writing or reading.

The current sensing circuit 44 is configured to measure a current of the flash memory 20. For example, the current sensing circuit 44 is configured to measure the current of the flash memory 20 during the writing, and output a current value. Specifically, a current-to-voltage conversion circuit 440 associated with the current sensing circuit 44 is connected between the voltage supply circuit 30 and the flash memory 20 (between power supplying lines). The current-to-voltage conversion circuit 440 has a current sensor. The current sensor is, for example, but not limited to, a resistor 441. When the voltage supply circuit 30 provides a current to the flash memory 20 by using the current-to-voltage conversion circuit 440, two ends of the current-to-voltage conversion circuit 440 generate a differential voltage (Vip, Vin, where Vip is referred to as a P potential, and Vin is referred to as an N potential). The current sensing circuit 44 divides the differential voltage (Vip, Vin) by an impedance of the current sensor (for example, but not limited to, an impedance of the resistor 441), to obtain a current value that is consumed by the flash memory 20 when the writing is performed by the flash 5 memory 20. Similarly, the current sensing circuit 44 may be also configured to measure a current that is consumed by the flash memory 20 when the erasing or the reading is performed by the flash memory 20, and output a current value.

The processor 46 is configured to output a control signal based on the current value. Specifically, the processor 46 receives the current value outputted by the current sensing circuit 44, and outputs a control signal based on the current value. In some embodiments, when the current value exceeds a preset current upper limit for single programming, the control signal outputted by the processor 46 is an abnormal signal, and the processor 46 can record a location of an error in the flash memory of the processor 46. The current upper limit for single programming may be a value of an abnormal current consumed by the flash memory 20 when the flash memory 20 performs single programming.

Another embodiment in which the processor 46 outputs the control signal based on the current value is described in the following.

Therefore, it can be learned from the foregoing description that, the flash memory controller 40 can instantly measure, by using the current sensing circuit 44, a current consumed by the flash memory 20 when the flash memory 20 performs programming, erasing, or reading. The processor 46 can determine, based on the current value, whether an operating status of the flash memory 20 is maintained in a normal state. By means of the instant measurement, the processor 46 not only can instantly learn, when an operation is performed by the flash memory 20, whether a page and a block are damaged, but also can use a statistical method to predict, by collecting a sufficient quantity of current values (based on a time sequence), a time when the flash memory 20 may be damaged, or to predict the number of times to be written, erased, and/or read.

In the next place, the current-to-voltage conversion circuit 440 associated with the current sensing circuit 44 in FIG. 1 is located outside the flash memory controller 40. However, in some embodiments, the current-to-voltage conversion circuit 440 is built in the flash memory controller 40, and the current outputted by the voltage supply circuit 30 still passes through the current-to-voltage conversion circuit 440 and then is transmitted to the flash memory 20.

Figure 2:
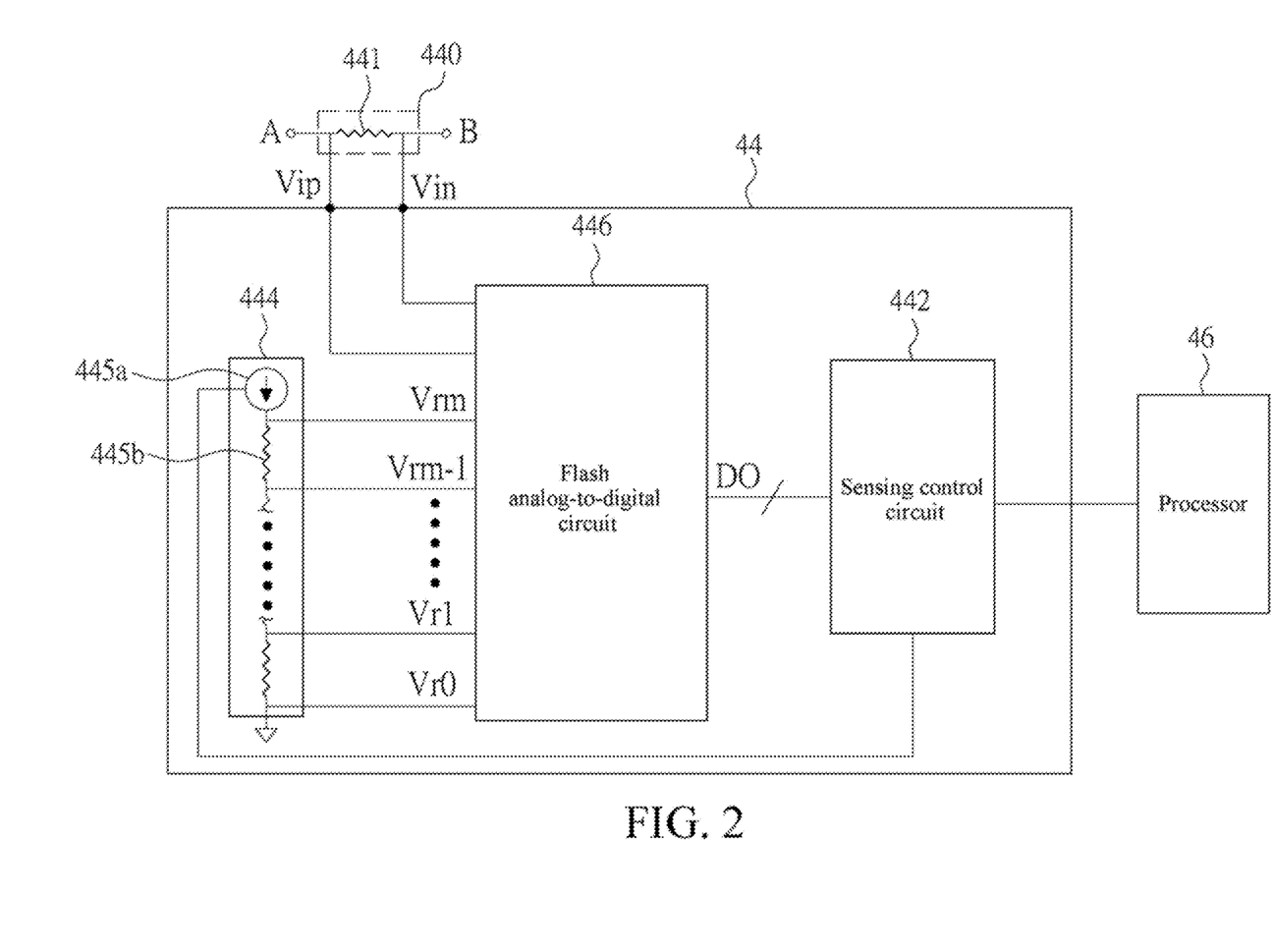
FIG. 2 illustrates a schematic circuit block diagram of a current sensing circuit according to an embodiment of this application.

Referring to FIG. 2, FIG. 2 illustrates a schematic circuit block diagram of a current sensing circuit according to an embodiment of this application. In some embodiments, the current sensing circuit 44 includes a current-to-voltage conversion circuit 440 (illustrated in FIG. 2 as being outside the current sensing circuit 44), a sensing control circuit 442, a state generation circuit 444, and a flash analog-to-digital circuit 446.

The current-to-voltage conversion circuit 440 is connected between the voltage supply circuit 30 and the flash memory 20 and is configured to convert the current into a differential input. A node A of the current-to-voltage conversion circuit 440 in FIG. 2 is connected to the voltage supply circuit 30, and a node B is connected to the flash memory 20. When the flash control circuit 42 controls the flash memory 20 to perform writing (programming or erasing) or reading, a current provided by the voltage supply circuit 30 passes through the resistor 441, and two ends (namely, the nodes A and B) of the resistor 441 respectively have a P potential Vip and an N potential Vin, that is, the two ends of the resistor 441 have a differential voltage (Vip, Vin). The current sensing circuit 44 obtains the current value by dividing a difference of the differential voltage (Vip−Vin) by an impedance of the resistor 441.

The sensing control circuit 442 is configured to generate a state signal. The state signal is related to the current value. A higher state signal indicates a larger range of measurable current values, and a lower state signal indicates a smaller range of measurable current values. This is described in detail in the following.

The state generation circuit 444 is configured to generate a plurality of states Vrm, Vrm−1 . . . , and Vr0 based on the state signal. A quantity of these states of the state generation circuit 444 is a resolution of the current sensing circuit 44. For example, if the state generation circuit 444 can generate two to three states, the flash analog-to-digital circuit 446 is configured as that an output is represented by using two bits, namely, DO[1:0]. If the state generation circuit 444 can generate four to seven states, the flash analog-to-digital circuit 446 is configured as that an output is represented by using three bits, namely, DO[2:0].

In some embodiments, the state generation circuit 444 includes an adjustable current source 445a and a plurality of resistors 445b. The adjustable current source 445a is configured to correspondingly generate a reference current based on the state signal. These resistors 445b are connected in series in sequence, and these resistors 445b receive the reference current and generate these states Vrm, Vrm−1 . . . , Vr1, and Vr0.

The sensing control circuit 442 uses the state signal to control a value of the reference current generated by the adjustable current source 445a. The adjustable current source 445a generates a larger reference current in responsive to a higher state signal. The adjustable current source 445a generates a smaller reference current in responsive to a lower state signal. The larger the reference current flows through the resistors 445b connected in series, the larger the voltage difference between two ends of these resistors 445b connected in series is. Therefore, the state generation circuit 444 can generate, in a same resolution, a larger voltage difference (Vrm−Vr0), and the sensing control circuit 442 can measure a larger difference of a differential voltage (corresponding to a current value). On the contrary, the smaller the reference current that flows through the resistors 445b connected is series, the smaller the voltage difference that exists between the two ends of these resistors 445b is. Therefore, the state generation circuit 444 can generate, in the same resolution, a smaller voltage difference (Vrm−Vr0) of a maximum state, and the sensing control circuit 442 can measure a smaller difference of a differential voltage.

The flash analog-to-digital circuit 446 is configured to output a digital signal based on the differential voltage (Vip−Vin) and these states Vrm, Vrm−1 . . . , and Vr0. In some embodiments, the flash analog-to-digital circuit 446 compares the difference of the differential voltage (Vip, Vin) with a difference of these states Vrm, Vrm−1 . . . , and Vr0 (Vrm−Vr0, Vrm−1−Vr0, and the like), to obtain a state difference corresponding to a difference of the differential voltage (Vip−Vin). The flash analog-to-digital circuit 446 converts the corresponding state difference into a binary value and outputs the digital signal based on the binary value. The digital signal corresponds to the state difference.

The sensing control circuit 442 outputs the current value based on the state signal and the digital signal. This is described in detail in the following.

Figure 3:
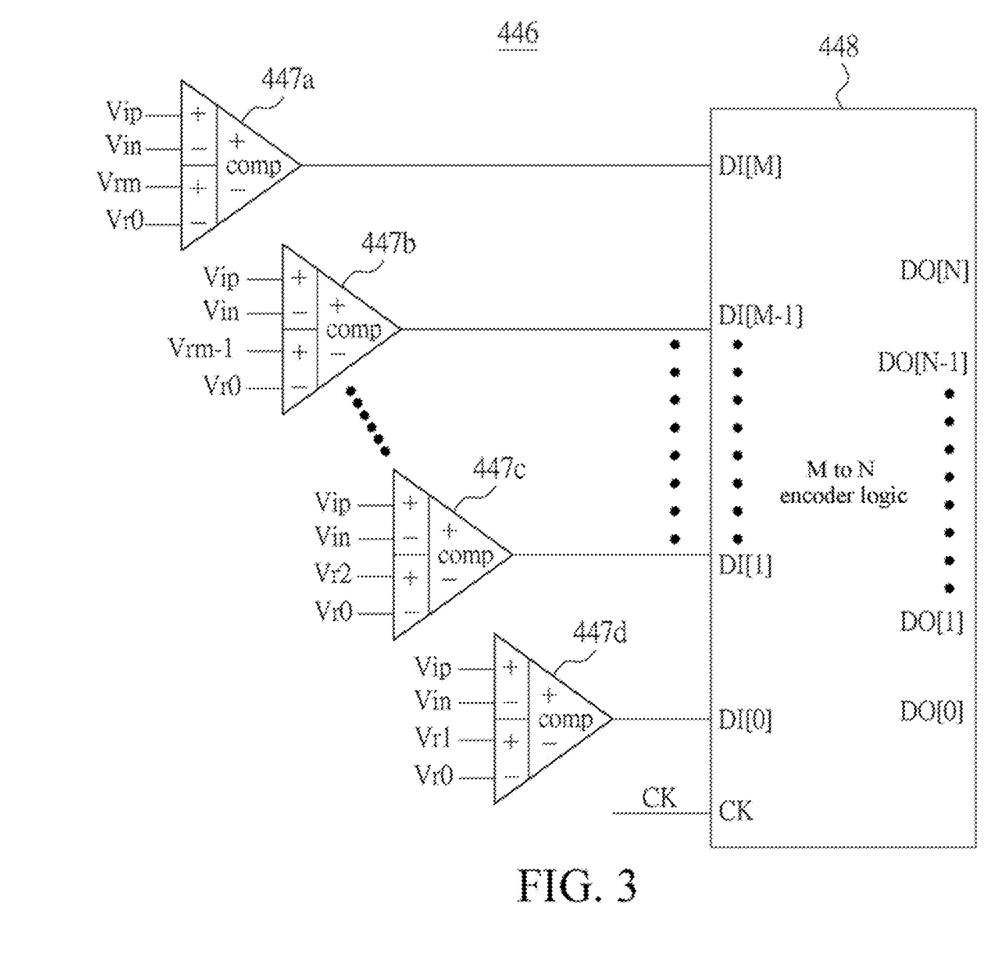
FIG. 3 illustrates a schematic circuit block diagram of a flash analog-to-digital circuit according to an embodiment of this application.

Referring to FIG. 3, FIG. 3 illustrates a schematic circuit block diagram of a flash analog-to-digital circuit according to an embodiment of this application. The flash analog-to-digital circuit 446 includes a plurality of differential comparators 447a, 447b, 447c, and 447d and an M to N encoder logic 448. The differential comparators 447a, 447b, 447c, and 447d receive and compare the difference of the differential voltage (Vip−Vin) with the corresponding state differences Vrm, Vrm−1 . . . , Vr2, Vr1, and Vr0. When the difference of the differential voltage (Vip−Vin) is greater than the corresponding state differences Vrm, Vrm−1 . . . , Vr2, Vr1, and Vr0, the differential comparators 447a, 447b, 447c, and 447d output 1 (high state). On the contrary, the differential comparators 447a, 447b, 447c, and 447d output 0 (low state). Therefore, when the difference of the differential voltage (Vip−Vin) falls between the state Vrm and the state Vrm−1, the first differential comparator 447a outputs 0, and the other differential comparators 447b, 447c, and 447d output 1.

The M to N encoder logic 448 is configured to: encode an input signal, convert the input signal into a binary value, and output a digital signal. Still using the foregoing example for description, if the flash analog-to-digital circuit includes four differential comparators 447a, 447b, 447c, and 447d, the first differential comparator 447a outputs 0, and the other differential comparators 447b, 447c, and 447d output 1. In this case, values received by the M to N encoder logic 448 are 0, 1, 1, and 1 from top down, and the M to N encoder logic 448 encodes the values as DO[2:0]=011 (binary). The M to N encoder logic 448 may be implemented by using a logical circuit.

Further referring to FIG. 2, and still using the example of the flash analog-to-digital circuit 446, if a quantity of these resistors 445b is four, resistance values of all resistor 445b are 1 k ohm, and the state signal outputted by the sensing control circuit 442 enables the reference current outputted by the adjustable current source 445 to be 10 uA, states generated by the state generation circuit 444 are 0 mV, 10 mV, 20 mV, 30 mV, and 40 mV. Voltage differences of these states include 10 mV, 20 mV, 30 mV, and 40 mV. In other words, the differential comparators 447a, 447b, 447c, and 447d respectively receive state voltage differences 40 mV, 30 mV, 20 mV, and 10 mV. When an output value of the digital signal is DO[2:0]=011 (binary), it indicates that the differential voltage outputted by the current-to-voltage conversion circuit 440 is 30 mV to 40 mV corresponding to DO[2:0]=011. If an impedance of the resistor 441 is 0.5 ohm, the current that is of the flash memory and that is during the writing is 60 mA to 80 mA.

In addition, still using the example of the flash analog-to-digital circuit 446, if a quantity of these resistors 445b is four, resistance values of all resistors 445b are 1 k ohm, and the state signal outputted by the sensing control circuit 442 enables the reference current outputted by the adjustable current source 445 to be 20 uA, states generated by the state generation circuit 444 are 0 mV, 20 mV, 40 mV, 60 mV, and 80 mV. Voltage differences of these states include 20 mV, 40 mV, 60 mV, and 80 mV. In other words, the differential comparators 447a, 447b, 447c, and 447d respectively receive state voltage differences 80 mV, 60 mV, 40 mV, and 20 mV. When an output value of the digital signal is DO[2:0]=011 (binary), it indicates that the differential voltage outputted by the current-to-voltage conversion circuit 440 is 60 mV to 80 mV corresponding to DO[2:0]=011. If an impedance of the resistor 441 is 0.5 ohm, the current that is of the flash memory and that is during the writing is 120 mA to 160 mA.

It can be learned from the foregoing two examples that, the flash analog-to-digital circuit 446 outputs the same digital signal. The voltage value represented by the same digital signal is related to the states. A higher state (state voltage difference) indicates a larger voltage value represented by the same digital signal, and a lower state (state voltage difference) indicates a smaller voltage value represented by the same digital signal. As described above, these states are determined by the state signal sent by the sensing control circuit 442. Therefore, the sensing control circuit 442 can obtain a corresponding voltage value and current value based on a state signal and a digital signal.

Second, during operation, the sensing control circuit 442 continuously obtains a plurality of current values. When digital signals continuously received by the sensing control circuit 442 are an output upper limit (where for the foregoing examples, the upper limit is DO[2:0]=100) of the flash analog-to-digital circuit 446, this indicates that all continuously received differential voltages are larger than a greatest state voltage difference (Vrm−Vr0) generated by the state generation circuit 444. Therefore, the sensing control circuit 442 adjusts the state signal to be higher, so that the current sensing circuit 44 can further measure an actual differential voltage value of the differential voltage. On the contrary, when the digital signals continuously received by the sensing control circuit 442 are an output lower limit (where for the foregoing examples, the output lower limit is DO[2:0]=000) of the flash analog-to-digital circuit 446, this indicates that all the continuously received differential voltages are less than a smallest state voltage difference (Vr1−Vr0) generated by the state generation circuit 444. Therefore, the sensing control circuit 442 adjusts the state signal to be lower, so that the current sensing circuit 44 can further measure an actual differential voltage value of the differential voltage.

It can be learned from the foregoing descriptions that, the sensing control circuit 442 receives a plurality of the digital signals based on a time sequence, and adjusts the state signal based on these digital signals. Specifically, by using continuously obtained current values, the sensing control circuit 442 determines a value of a state signal outputted by the sensing control circuit 442, to more accurately measure a current value consumed by the flash memory 20. When most of digital signals continuously received by the sensing control circuit 442 (for example, but not limited to, 90% of the continuously received digital signals) are between an output upper limit and an output lower limit of the flash analog-to-digital circuit 446, it indicates that a current state signal is proper and the sensing control circuit 442 maintains a value of the state signal. Second, when the flash memory controller 40 begins to run, the sensing control circuit 442 may use a preset value as the state signal, and can obtain a proper state signal after state signal adjustment is performed for a period of time. This preset value may be designed or tested by the flash memory controller 40, and is obtained based on an experiment.

A sampling frequency of the flash analog-to-digital circuit 446 is related to duration of single programming, erasing, and reading of the flash memory 20. Using a time-current graph of the flash memory 20 in FIG. 5 as an example (described in detail in the following), the figure shows that the duration of the single programming is approximately five microseconds (us), and if five sampling points need to be obtained (five digital signals need to be obtained) within the duration of the single programming, the sampling frequency of the flash analog-to-digital circuit 446 may be 1 MHz.

Figure 4:
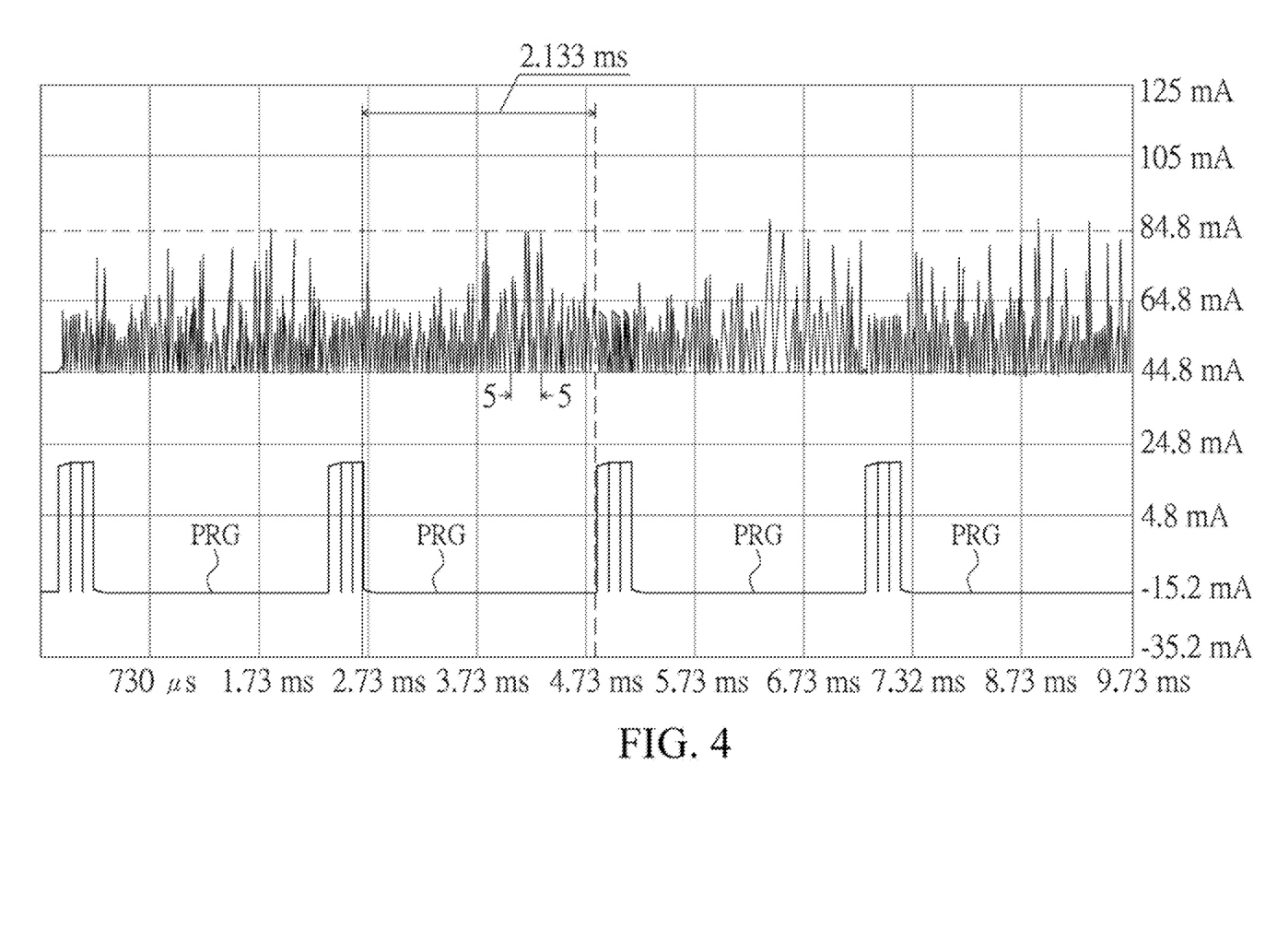
FIG. 4 illustrates a schematic diagram of a current sensing result of a current sensing circuit according to an embodiment of this application.
Figure 5:
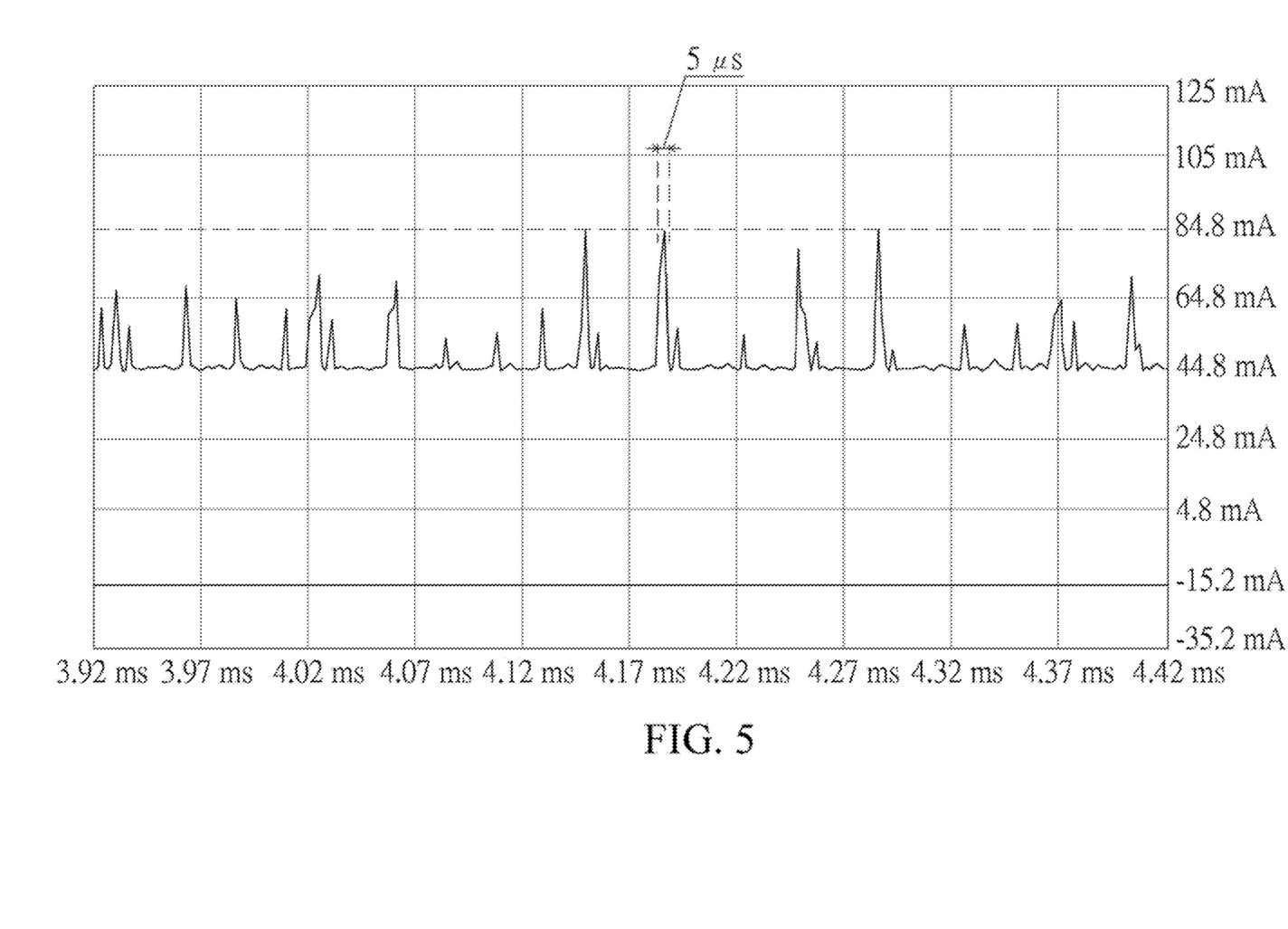
FIG. 5 illustrates a locally magnified schematic diagram of a location 5-5 indicated in FIG. 4.

To help understand some embodiments in which the processor 46 outputs the control signal based on the current value consumed by the flash memory 20, a time-current graph drawn based on a plurality of current values received by the processor 46 is first described herein. First referring to both FIG. 4 and FIG. 5, FIG. 4 illustrates a schematic diagram of a current sensing result of a current sensing circuit according to an embodiment of this application. FIG. 5 illustrates a locally magnified schematic diagram of a location 5-5 indicated in FIG. 4.

FIG. 4 illustrates a time-current graph, according to some embodiments, that is drawn based on current values outputted by the current sensing circuit 44 and continuously received by the processor 46 when the processor 40 performs a data programming task on the flash memory 20 by using the flash control circuit 42. A horizontal axis of the graph indicates time (from 730 microseconds us to 9.73 microseconds ms), and a vertical axis of the graph indicates a current value. In the time-current graph, an upper curve indicates a current value during programming, and a lower curve indicates a program running in the flash memory 20. For example, the figure shows time intervals of PRG during which the flash memory 20 is performing programming, and during a time interval between two adjacent programming PRG intervals, the flash control circuit 42 transmits data to the flash memory 20. Similarly, when the processor 46 performs a data erasing task on the flash memory 20 by using the flash control circuit 42, a time-current graph about erasing may alternatively be obtained. When the processor 46 performs a data reading task on the flash memory 20 by using the flash control circuit 42, a time-current graph about reading may alternatively be obtained.

It can be learned from FIG. 5 that, a noise state current value is approximately 44.8 mA. Within an interval from 3.92 ms to 4.42 ms, a maximum current during a process of programming is approximately 40 mA (namely, 84.8−44.8 mA), and within a time interval of the program, a relatively small current is approximately 5.2 mA (namely, 50−44.8 mA). It can be learned from the plurality of current values within the PRG intervals in FIG. 5 that, most measured current values (referred to as programming current values, where details are described in the following) are all between 5.2 mA and 40 mA, and no excessive current values are at a lower limit or an upper limit. This indicates that a state signal outputted by the sensing control circuit 442 is proper, and the state signal does not need to be adjusted to be higher or lower.

A single programming interval (PRG) in FIG. 4 corresponds to programming of a particular page (referred to as page programming). For example, a time interval from 3.92 ms to 4.42 ms in FIG. 5 corresponds to "page programming" of a particular page. Each "page programming" includes a plurality of "programming tasks". In other words, a peak value of each current in FIG. 5 respectively corresponds to one programming task performed by the flash memory 20 on the page. A current value measured during a single programming task is referred to as a programming current value. The programming task means that, after receiving data on which writing (including programming and erasing) needs to be performed and that is transmitted by the flash control circuit 42 (these data on which writing needs to be performed respectively corresponds to 111, 011, 001, 010, 100, 000, 101, and 110, and is divided into a total of eight groups), the flash memory 20 separately performs one (a first) programming task on each cell in a writing page. In some embodiments, a programming pulse used by the first programming task corresponds to a lowest voltage state in the foregoing one erasing state and seven programming states. After the first programming task is completed, whether a cell into which the lowest voltage state needs to be written already has the lowest voltage state is determined (referred to as verification). If the lowest voltage state is reached, the flash memory 20 does not apply a programming pulse to these cells during a next (a second) programming task. That is, the flash memory 20 performs only a programming task corresponding to a second lowest voltage state on the other cells. After completing the second programming task, the flash memory 20 also performs verification. The rest can be deduced by analogy, until a programming task corresponding to a highest voltage state is completed. In other words, one to N (where, N is a positive integer greater than 1) programming pulses are applied to each cell based on data content that needs to be stored in each cell.

As described above, in a normal situation, the flash memory 20 may successfully program each cell after applying one to N programming pulses. In other words, after N programming task are performed on the cell, a recorded voltage stored in the cell can be within a corresponding programming state interval. In FIG. 4 and FIG. 5, a large current value corresponds to a programming task of a cell that has a relatively large quantity of programming tasks (where, a programming state of data stored in the cell is relatively high), and a relatively small current value corresponds to a programming task of a cell that has a relatively small quantity of programming tasks (where, a programming state of data stored in the cell is relatively low). Using a triple-level cell as an example, a programming state of data 011 is lower than a programming state of data 110. Therefore, when the flash memory 20 programs 011 for a cell, a required current is lower than a current for programming 110.

On the contrary, when a cell is excessively worn or is close to the end of life, a quantity of programming tasks performed by the flash memory 20 on the cell is larger than a normal quantity, and then a recorded voltage stored in the cell can conform to a corresponding programming state. Therefore, an overall current consumed for programming the cell is greater than that of a normal cell. If an entire page or block includes a relatively larger amount cells that are excessively worn or are close to end of life, total current consumption corresponding to the page or the block is increased. Therefore, by setting a sum of total current values of a page and a block sum threshold, the processor 46 can determine whether the page or the block is abnormal or is to be abnormal.

The following describes some embodiments in which the processor 46 outputs the control signal based on the current value consumed by the flash memory 20.

In some embodiments, based on a current value, the processor 46 determines whether a page or a block in the flash memory 20 is in a normal state, and outputs a corresponding control signal. Specifically, when receiving a plurality of current values corresponding to a page, the processor 46 determines whether these current values are normal. The control signal outputted by the processor 46 is a normal signal when these current values are normal. The control signal outputted by the processor 46 is an abnormal signal when these current values are abnormal. The current value may be a current value during a page writing task, a current value during a page programming task, a current value during a page erasing task, or a current value during a page reading task.

In some embodiments, the manner of determining based on the plurality of current values is: When a sum of total current values corresponding to a page is greater than a page sum threshold, the page is abnormal; on the contrary, the page is normal. The page sum threshold refers to a total current value cumulatively consumed in the flash memory 20 when writing (including programming or erasing) is performed on a page. In some embodiments, a sum of total programming current values corresponding to a page is greater than a page programming sum threshold, the page is abnormal; on the contrary, the page is normal. The total current values of the page may alternatively be a total current values of page erasing, and the page sum threshold corresponds to a page erasing sum threshold.

In some embodiments, the manner of determining based on the plurality of current values is: in a page, when a proportion of a quantity of programming current values greater than a programming current upper limit to an overall quantity is greater than twenty percent, the page is abnormal; on the contrary, the page is normal. The programming current value refers to a current value measured during each programming task when the flash memory 20 performs page programming, for example, each peak value in FIG. 5. The programming current upper limit means that, when the flash memory 20 performs a single programming task, if a current of the flash memory 20 is greater than the programming current upper limit, it indicates that most cells of the page are likely to be damaged. Therefore, if during page programming, a proportion of a total quantity of times for which the programming current value is greater than the programming current upper limit to a total quantity of overall programming tasks (namely, a quantity of programming tasks during the page programming) is greater than twenty percent, it is determined that the page is abnormal.

In some embodiments, a sum of total current values corresponding to a block is greater than a block sum threshold, the block is abnormal; on the contrary, the block is normal. The total current values of the block and the block sum threshold may alternatively be changed to a total current value of a block and a block sum threshold for programming and erasing. In some embodiments, the manner of determining based on the plurality of current values is: in a block, when a proportion of a quantity of programming current values greater than a programming current upper limit to an overall quantity is greater than twenty percent, the block is abnormal; on the contrary, the block is normal.

In some embodiments, when the processor 46 receives the plurality of current values, the processor 46 compares these currents with a predetermined current template, to determine whether these current values are normal. The control signal outputted by the processor 46 is a normal signal when these current values are normal. The control signal outputted by the processor 46 is an abnormal signal when these current values are abnormal. The predetermined current template is an inter-page slope upper limit. The processor 46 determines a plurality of current values of a plurality of pages that are continuously received. For example, the processor 46 calculates an average value of 10% largest current values in each page, performs an approximation line operation on these average values of continuous pages, and obtains a slope of an approximation line. When the slope of the approximation line is greater than a slope upper limit for continuous pages, the processor 46 determines that these pages are abnormal or blocks of these pages are abnormal, and the outputted control signal is an abnormal signal.

The meaning of the foregoing determining, by the processor 46 based on a current value, that a page or a block is abnormal is not that the page or the block is already damaged but is likely to be damaged. Therefore, the abnormality may mean that the page or a block tends to be damaged. The meaning of the foregoing determining, by the processor 46 based on a current value, that a page or a block is abnormal is that the page or the block is not abnormal based on the determining manner, but does not indicate that the page or the block is not determined as being abnormal (likely to be damaged) by using another determining manner. When determining based on a determining manner that a page or a block is normal, the processor 46 may do not output the control signal.

When the control signal outputted by the processor 46 is abnormal, the processor 46 may further indicate that a page or a block corresponding to the abnormality is damaged, to avoid an error that occurs in information written into the page or the block. The processor 46 may use a bad block management (BBM) mechanism to manage a damaged block.

The page sum threshold, the page programming sum threshold, the page erasing sum threshold, the programming current upper limit, the sum of the total current values of the page, the block sum threshold, and the inter-page slope upper limit in some of the foregoing embodiments may be obtained by using an experiment. For example, an aging test may be performed on a plurality of flash memories 20, and current values consumed by the flash memories 20 may be continuously measured. These thresholds, sums, and upper limits can be obtained after statistics are collected and a security coefficient is considered. Alternatively, these thresholds, sums, and upper limits are obtained by performing an aging test on different pages or blocks in a same flash memory 20 or by using any statistic and prediction method.

In summary, according to some embodiments, the flash memory controller can instantly obtain a current value consumed by the flash memory during an operation of the flash memory when the flash memory runs, and determine, based on the current value, whether the flash memory runs normally. According to some other embodiments, the storage apparatus having the flash memory controller can instantly determine whether the flash memory runs normally.

What is claimed is:

1. A flash memory controller, suitable for a NAND flash memory and a voltage supply circuit, the voltage supply circuit supplying a current to the flash memory, the flash memory controller comprising:
a flash control circuit, configured to control an operation of the flash memory;
a current-to-voltage conversion circuit, connected between the voltage supply circuit and the flash memory;
a current sensing circuit configured to measure a supply current being drawn by a voltage supply input of the flash memory during the operation of the flash memory, and to output a current value; wherein the current-to-voltage conversion circuit is configured to convert the supply current into a differential voltage; wherein the current sensing circuit comprises:
a sensing control circuit, configured to generate a state signal;
a state generation circuit, configured to generate a plurality of states, wherein a resolution of the plurality of states is based on the state signal; and
a flash analog-to-digital circuit, configured to output a digital signal based on the differential voltage and these states, wherein the sensing control circuit outputs the current value based on the state signal and the digital signal; and
a processor, configured to output a control signal based on the current value, the control signal indicating whether a page or a block of memory in the flash memory is operating normally.

2. The flash memory controller according to claim 1, wherein the state generation circuit comprises:
an adjustable current source, configured to generate a reference current based on the state signal; and
a plurality of resistors, connected in series, wherein these resistors receive the reference current and generate these states.

3. The flash memory controller according to claim 2, wherein the sensing control circuit receives a plurality of the digital signals based on a time sequence, and adjusts the state signal based on these digital signals.

4. A storage apparatus, comprising:
a flash memory;
a voltage supply circuit, configured to provide a current to the flash memory;
a current-to-voltage conversion circuit, connected between the voltage supply circuit and the flash memory; and
a flash memory controller, comprising:
a flash control circuit, configured to control an operation of the flash memory;
a current sensing circuit, configured to measure a supply current being drawn by s supply voltage input of the flash memory during the operation of the flash memory, and output a current value, wherein the current-to-voltage conversion circuit is configured to convert the supply current into a differential voltage, wherein the current sensing circuit comprises:
a sensing control circuit, configured to generate a state signal;
a state generation circuit, configured to generate a plurality of states, wherein a resolution of the plurality of states is based on the state signal; and
a flash analog-to-digital circuit, configured to output a digital signal based on the differential voltage and these states, wherein the sensing control circuit outputs the current value based on the state signal and the digital signal; and
a processor, configured to output a control signal based on the current value, the control signal indicating whether a page or a block of memory in the flash memory is operating normally.

5. The storage apparatus according to claim 4, wherein the state generation circuit comprises:
   an adjustable current source, configured to generate a reference current based on the state signal; and
   a plurality of resistors, connected in series, wherein these resistors receive the reference current and generate these states.

6. The storage apparatus according to claim 5, wherein the sensing control circuit adjusts the state signal based on the digital signal generated by the flash analog-to-digital circuit.

7. The storage apparatus according to claim 4, wherein when receiving a plurality of the current values, the processor compares these current values with a predetermined current template, to determine whether these current values are normal, and when these current values are normal, the control signal outputted by the processor is a normal signal, or when these current values are abnormal, the control signal is an abnormal signal.

8. A method applied to a flash memory controller, suitable for a flash memory and a voltage supply circuit, the voltage supply circuit supplying a current to the flash memory, the method comprising:
   controlling, by the flash memory controller, an operation of the flash memory;
   converting a supply current being drawn by a voltage supply input of the flash memory during the operation of the flash memory into a differential voltage;
   generating a state signal;
   generate a plurality of states according to the state signal, wherein a resolution of the plurality of states is based on the state signal;
   generating the digital signal based on the differential voltage and the plurality of states,
   generating a current value based on the state signal and the digital signal; and
   outputting a control signal based on the current value, the control signal indicating whether a page or a block of memory in the flash memory is operating normally.

9. The method according to claim 8, wherein the differential voltage is generated by a current-to-voltage conversion circuit, wherein the current-to-voltage conversion circuit is connected between the voltage supply circuit and the flash memory.

10. The method according to claim 8, wherein the step of generating the plurality of states further comprises:
    generating a reference current based on the state signal; and
    generating, by a plurality of resistors connected in series, the plurality of states according to the reference current.

11. The method according to claim 10, wherein when the state signal is a maximum state, a difference between the state signals is a maximum difference.

12. The method according to claim 8, further comprising:
    adjusting the state signal based on the digital signal.

* * * * *